United States Patent [19]

Nagashima et al.

[11] Patent Number: 5,129,958
[45] Date of Patent: Jul. 14, 1992

[54] CLEANING METHOD FOR SEMICONDUCTOR WAFER PROCESSING APPARATUS

[75] Inventors: Makoto Nagashima, Machida; Naoaki Kobayashi, Sakura, both of Japan; Jerry Wong, Fremont, Calif.

[73] Assignee: Applied Materials, Inc., Santa Clara, Calif.

[21] Appl. No.: 707,254

[22] Filed: May 23, 1991

Related U.S. Application Data

[63] Continuation of Ser. No. 411,433, Sep. 22, 1989, abandoned.

[51] Int. Cl.⁵ .................................................. B44C 1/22
[52] U.S. Cl. ........................................ 134/22.1; 134/26; 134/30; 134/36; 156/345; 156/643
[58] Field of Search ................ 134/22.1, 26, 30, 36; 156/345, 643

[56] References Cited

U.S. PATENT DOCUMENTS

| | | | |
|---|---|---|---|
| 4,529,474 | 7/1985 | Fujiyama et al. | 134/1 |
| 4,581,101 | 4/1986 | Senoue et al. | 156/643 |
| 4,657,616 | 4/1987 | Benzing et al. | 134/22.1 |
| 4,749,440 | 6/1988 | Blackwood et al. | 134/3 |
| 4,778,532 | 10/1988 | McConnel et al. | 134/28 |
| 4,797,178 | 1/1989 | Bui et al. | 134/1 |
| 4,820,377 | 4/1989 | Davis et al. | 134/1 |
| 4,857,139 | 8/1989 | Tashiro et al. | 134/1 |
| 4,975,147 | 12/1990 | Tahara et al. | 134/31 |

FOREIGN PATENT DOCUMENTS

0237153 9/1987 European Pat. Off. .
0296891 12/1988 European Pat. Off. .

Primary Examiner—Anthony McFarlane
Attorney, Agent, or Firm—John P. Taylor

[57] ABSTRACT

An improvement in a method for cleaning a CVD deposition chamber in a semiconductor wafer processing apparatus is described. The improvement comprises the treatment of fluorine residues in the CVD deposition chamber, left from a prior fluorine plasma cleaning step, by contacting such fluorine residues with one or more reducing gases which will react with the fluorine residues to form one or more gaseous or solid reaction products or a mixture of same.

20 Claims, 1 Drawing Sheet

```
┌─────────────────────────────────────┐
│      PROVIDING A CVD DEPOSITION     │
│       CHAMBER HAVING FLUORINE       │
│   RESIDUES FROM A PREVIOUS CLEANING │
│     STEP USING A FLUORINE PLASMA    │
└─────────────────────────────────────┘
                   │
                   │
┌─────────────────────────────────────┐
│    CONTACTING THE FLUORINE RESIDUES │
│       IN THE CVD DEPOSITION CHAMBER │
│   WITH ONE OR MORE REDUCING GASES TO│
│    FORM ONE OR MORE REACTION PRODUCTS│
└─────────────────────────────────────┘
                   │
                   │
┌─────────────────────────────────────┐
│     OPTIONALLY REMOVING AT LEAST A  │
│    PORTION OF THE REACTION PRODUCTS │
│     FROM THE CVD DEPOSITION CHAMBER │
└─────────────────────────────────────┘
```

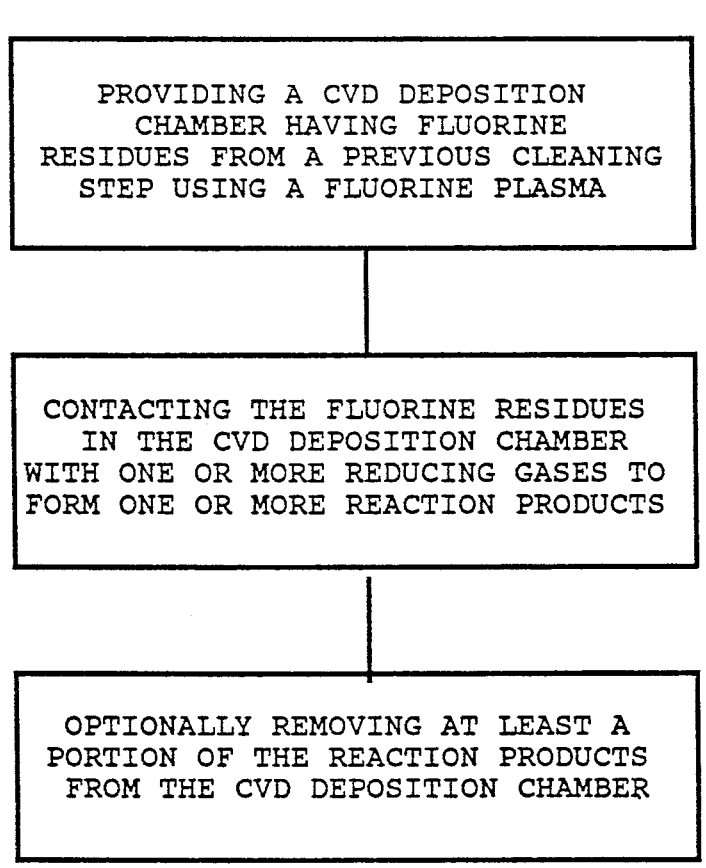

CLEANING METHOD FOR SEMICONDUCTOR WAFER PROCESSING APPARATUS

This is a continuation of copending application Ser. No. 07/411,433 filed on Sep. 22, 1989, now abandoned.

BACKGROUND OF THE INVENTION

1. Field of the Invention

This invention relates to an improvement in the method of cleaning apparatus used in the processing of semiconductor wafers. More particularly, this invention relates to an improvement in a method used for cleaning semiconductor wafer chemical vapor deposition apparatus.

2. Description of the Related Art

In the deposition of materials on semiconductor wafers by chemical vapor deposition (hereinafter called "CVD deposition") or plasma assisted CVD deposition, coating residues such as, for example, silicon oxide or silicon nitride materials, are deposited on all exposed surfaces in the CVD deposition chamber, as well as the intended deposition on the semiconductor wafer. Such residues, which may accumulate to thicknesses of as much as 0.5 to 10 microns, usually must be removed from the chamber prior to the next deposition.

Conventionally, the CVD chamber is cleaned to remove such residues using a fluorine plasma. While such a cleaning method is effective for removing such undesirable deposition residues, fluorine residues are, in turn, left on the CVD chamber surfaces by such a cleaning step. The presence of such fluorine residues, during a subsequent deposition, may adversely affect the deposited film quality, including poor step coverage, poor reproducibility of runs, and pinholes.

The problem of removing such unwanted fluorine residues has been dealt with in the prior art either by flushing the CVD deposition chamber with an inert gas to eventually remove a sufficient amount of the fluorine residue or by deposition of a thin layer of oxide or nitride over the fluorine residues, e.g., about 500 to 2000 Angstroms of oxide or nitride.

The first such solution to the problem, however, is time consuming, requiring as long as 10 minutes to adequately remove such fluorine residues by inert gas flushing. The second solution to the problem is somewhat self-defeating since the plasma fluorine cleaning step which results in the presence of the fluorine residues is intended to remove such oxide or nitride coatings.

It would, therefore, be desirable to provide an improvement in the method of cleaning CVD deposition apparatus to eliminate or mitigate the deleterious effects of such fluorine residues in the CVD deposition chamber of such apparatus.

SUMMARY OF THE INVENTION

It is, therefore, an object of this invention to provide an improvement in a method for cleaning a CVD deposition chamber in a semiconductor wafer processing apparatus which comprises contacting fluorine residues, remaining therein from a plasma fluorine cleaning step, with one or more reducing gases.

It is another object of this invention to provide an improvement in a method for cleaning a CVD deposition chamber in a semiconductor wafer processing apparatus which comprises reacting fluorine residues, remaining therein from a plasma fluorine cleaning step, with one or more reducing gases to form one or more gaseous reaction products removable from the chamber.

It is yet another object of this invention to provide an improvement in a method for cleaning a CVD deposition chamber in a semiconductor wafer processing apparatus which comprises reacting fluorine residues, remaining therein from a plasma fluorine cleaning step, with one or more reducing gases to form one or more reaction products in the CVD deposition chamber which will not interfere with subsequent depositions.

These and other objects of the invention will be apparent from the following description and accompanying flow sheet.

BRIEF DESCRIPTION OF THE DRAWINGS

The sole drawing is a flow sheet illustrating the improved cleaning method of the invention.

DETAILED DESCRIPTION OF THE INVENTION

The invention comprises an improvement in a method for cleaning a CVD deposition chamber in a semiconductor wafer processing apparatus wherein fluorine residues in the CVD deposition chamber, left from a prior fluorine plasma cleaning step, are contacted with one or more reducing gases.

Since the prior art fluorine plasma cleaning step may be used to remove deposition materials coated on the surfaces of either a plasma-assisted CVD deposition chambers or a non-plasma-assisted CVD deposition chamber, the invention may be used in connection with the treatment of the resulting fluorine residues formed in either a plasma-assisted CVD deposition chamber or a non-plasma-assisted CVD deposition chamber. It will, therefore, be understood that when a CVD deposition chamber is referred to herein in connection with the practice of the invention, the term is intended to include both types of deposition chambers unless further defined to the contrary.

The one or more reducing gases which contact the fluorine residues, in accordance with the invention, may comprise any reducing gases capable of reacting with the fluorine residues to form one or more reaction products. Examples of such reducing gases include silane ($SiH_4$), ammonia, hydrogen, phosphine ($PH_3$), diborine ($B_2H_6$), and arsine ($AsH_3$). Other reducing gases may be used, but silane, ammonia, and hydrogen are preferred since they do not introduce into the deposition chamber any elements other than those already in use in deposition processes usually conducted in the CVD deposition chamber, i.e., Si, N, and H. Mixtures of more than one reducing gas may also be used if desired.

The one or more reaction products which may be formed during contact of the fluorine residues with the one or more reducing gases may comprise one or more gaseous reaction products, which will then be removed from the CVD deposition chamber during the course of normal evacuation or pumping procedures used to maintain a vacuum with the chamber.

Alternatively, one or more solid reaction products may be formed by the reaction between the one or more reducing gases and the fluorine residues which may comprise particles or a coating on the chamber surfaces or a combination thereof. Such solid reaction products have been found (unlike the fluorine residues) to be relatively inert, i.e., to not interfere, with subsequent CVD deposition processes carried out in the chamber.

It is also possible that combinations of such gaseous and solid reaction products may be formed in the CVD deposition chamber The fluorine residues are contacted by the one or more reducing gases for a period of from as little as about 10 seconds up to 5 minutes or longer. While longer time periods may be used without any deleterious effects, such extended times usually are not necessary and, therefore, are not economically feasible. Usually when one or more solid reaction products are being formed in the chamber, contact times of less than a minute may be used, while in the formation of gaseous reaction products, contact periods of 1 minute or more may be preferred.

The one or more reducing gases are introduced into the CVD deposition chamber at a rate which may vary from as little as 100 sccm to as high as 500 standard cubic centimeters per minute sccm or higher, while maintaining the temperature in the chamber at from about 250° to about 500° C., preferably from about 350° to about 400° C.

In a preferred embodiment, the pressure in the CVD deposition chamber is maintained at from about 1 to about 20 Torr during the reaction between the one or more reducing gases and the fluorine residues. Pressures, however, as low as about $10^{-3}$ Torr, or as high as about 100 Torr may be maintained during the reaction.

To further illustrate the improvement in the method for cleaning a CVD deposition chamber in a semiconductor wafer processing apparatus, a silane ($SiH_4$) reducing gas was flowed for 10 seconds through a 5 liter CVD deposition chamber which had previously been cleaned using a fluorine plasma, leaving fluorine residues therein. The silane gas was flowed through the chamber at a rate of 200 sccm while the temperature of the chamber was maintained at a temperature of between 350°–400° C.

Analysis of the chamber before and after the cleaning step of the invention showed that less than 1.0% of the fluorine residues originally present in the chamber after cleaning with the fluorine plasma remained in unreacted form in the chamber after contact of the fluorine residues with the reducing gas in accordance with the invention. Analysis by secondary ion mass spectroscopy (SIMS) of a film subsequently deposited on a silicon wafer in the chamber showed that less than $5 \times 10^{20}$ atoms/cc of fluorine were present in the deposited film.

To illustrate formation of a gaseous reaction product in the practice of the improvement in the method for cleaning a CVD deposition chamber in a semiconductor wafer processing apparatus, a silane ($SiH_4$) reducing gas was flowed for about 1 minute through a 5 liter CVD deposition chamber which had previously been cleaned using a fluorine plasma, leaving fluorine residues therein. The reducing gas was flowed through the chamber at a rate of 200 sccm while the temperature of the chamber was maintained at a temperature of between 350°–400° C.

Analysis of the CVD deposition chamber after contact of the fluorine residues with the reducing gas showed less than 0.05% of the original fluorine residues remaining in the CVD deposition chamber after the cleaning step of the invention. Analysis by SIMS of a film subsequently deposited on a silicon wafer in the chamber showed that less than $1 \times 10^{19}$ atoms/cc of fluorine were present in the deposited film after cleaning by this method Thus, the invention provides an improvement in the method for cleaning a CVD deposition chamber wherein a fluorine plasma has been used to remove deposition materials from the surfaces of the deposition chamber resulting in the formation of fluorine residues wherein such fluorine residues are contacted with one or more reducing gases which react with the fluorine residues to form either gaseous reaction products removable from the deposition products or solid reaction products which will not interfere with subsequent depositions in the chamber, or mixtures of same.

Having thus described the invention, what is claimed is:

1. An improvement in a method for cleaning a chemical vapor deposition (CVD) chamber in a semiconductor wafer processing apparatus which comprises contacting fluorine residues remaining therein from a plasma fluorine cleaning step with one or more reducing gases.

2. The improvement of claim 1 wherein said step of contacting said fluorine residues with said one or more reducing gases further includes reacting said reducing gas with said fluorine residues to form one or more solid reaction products in said CVD deposition chamber.

3. The improvement of claim 1 wherein said step of contacting said fluorine residues with said one or more reducing gases further includes reacting said reducing gas with said fluorine residues to form one or more gaseous reaction products and said improvement further includes the step of removing at least a portion of said one or more gaseous reaction products from said CVD deposition chamber.

4. The improvement of claim 1 wherein said step of contacting said fluorine residues with said one or more reducing gases further includes reacting said one or more reducing gases with said fluorine residues to form one or more solid reaction products and one or more gaseous reaction products in said CVD deposition chamber.

5. The improvement of claim 4 including the further step of removing at least a portion of said one or more reaction products from said CVD deposition chamber.

6. The improvement of claim 2 wherein said step of reacting said fluorine residues with said one or more reducing gases to form one or more solid reaction products further comprises contacting said fluorine with said reducing gas for a period of at least about 10 seconds.

7. The improvement of claim 3 wherein said step of reacting said fluorine residues with said one or more reducing gases to form one or more gaseous reaction products further comprises contacting said fluorine with said reducing gas for a period of at least about 1 minute.

8. The improvement of claim 1 wherein said step of contacting said fluorine residues with said one or more reducing gases further comprises contacting said fluorine residues with said reducing gas while maintaining said CVD deposition chamber at a temperature of from about 250° C. to about 500° C.

9. The improvement of claim 1 wherein said step of contacting said fluorine residues with said one or more reducing gases further comprises contacting said fluorine with said reducing gas while maintaining said CVD deposition chamber at a temperature of from about 350° C. to about 400° C.

10. The improvement of claim 1 wherein said step of contacting said fluorine residues with said one or more reducing gases further comprises flowing said reducing gas into said CVD deposition chamber at a rate of at least about 100 standard cubic centimeters per minute (sccm).

11. The improvement of claim 10 wherein said step of contacting said fluorine residues with said one or more reducing gases further comprises flowing said reducing gas into said CVD deposition chamber at a rate of from about 100 sccm to about 500 sccm.

12. The improvement of claim 1 wherein said step of contacting said fluorine residues with said one or more reducing gases further comprises maintaining a pressure of at least about $10^{-3}$ Torr in said CVD deposition chamber during said contacting step.

13. The improvement of claim 12 wherein said step of contacting said fluorine residues with one or more reducing gases products further comprises maintaining a pressure of from at least about $10^{-3}$ Torr up to about 100 Torr in said CVD deposition chamber during said contacting step.

14. The improvement of claim 13 wherein said step of contacting said fluorine residues with said one or more reducing gases further comprises maintaining a pressure of from about 1 Torr up to about 20 Torr in said CVD deposition chamber during said contacting step.

15. The improvement of claim 1 wherein said one or more reducing gases are selected from the class consisting of silane ($SiH_4$), ammonia, hydrogen, phosphine ($PH_3$), diborine ($B_2H_6$), and arsine ($AsH_3$).

16. An improved method for cleaning a chemical vapor deposition (CVD) chamber in a semiconductor wafer processing apparatus wherein the improvement comprises contacting fluorine residues remaining therein from a plasma fluorine cleaning step with one or more reducing gases flowing into said chamber at a rate of at least 100 sccm for at least about 10 seconds to form one or more reaction products, while maintaining said CVD deposition chamber at a temperature of at least about 250° C. and a pressure of at least about $10^{-3}$ Torr.

17. The improved method of claim 16 wherein said step of contacting said fluorine residues with said one or more reducing gases further includes reacting said reducing gas with said fluorine residues to form one or more solid reaction products in said CVD deposition chamber.

18. The improved method of claim 16 wherein said step of contacting said fluorine residues with said one or more reducing gases further includes reacting said reducing gas with said fluorine residues to form one or more gaseous reaction products and said improvement further includes the step of removing said one or more gaseous reaction products from said CVD deposition chamber.

19. The improved method of claim 16 wherein said step of contacting said fluorine residues with said one or more reducing gases further includes reacting said reducing gas with said fluorine residues to form one or more solid reaction products and one or more gaseous reaction products in said CVD deposition chamber and said improvement further comprises the step of removing at least a portion of said reaction products from said CVD deposition chamber.

20. An improved method for cleaning a chemical vapor deposition (CVD) chamber in a semiconductor wafer processing apparatus wherein the improvement comprises contacting fluorine residues remaining therein from a plasma fluorine cleaning step with one or more reducing gases selected from the class consisting of silane ($SiH_4$), ammonia, hydrogen, phosphine ($PH_3$), diborine ($B_2H_6$), and arsine ($ArH_3$) flowing into said chamber at a rate of from about 100 to about 500 sccm for at least about 10 seconds to form one or more reaction products, while maintaining said CVD deposition chamber at a temperature of from about 250° C. to about 500° C. and at a pressure of at least about $10^{-3}$ Torr.

* * * * *